US008137901B2

(12) United States Patent  
Tsai et al.

(10) Patent No.: US 8,137,901 B2
(45) Date of Patent: Mar. 20, 2012

(54) METHOD FOR FABRICATING AN IMAGE SENSOR

(75) Inventors: Hsin-Ting Tsai, Hsinchu (TW);  
Cheng-Hung Yu, Taoyuan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 296 days.

(21) Appl. No.: 12/128,600

(22) Filed: May 28, 2008

(65) Prior Publication Data

US 2009/0294888 A1    Dec. 3, 2009

(51) Int. Cl.  
*G03F 7/20* (2006.01)

(52) U.S. Cl. .................. 430/321; 430/320

(58) Field of Classification Search .............. None  
See application file for complete search history.

(56) References Cited

U.S. PATENT DOCUMENTS

| | | | | |
|---|---|---|---|---|
| 5,753,417 | A * | 5/1998 | Ulrich .................. | 430/312 |
| 6,132,940 | A * | 10/2000 | Mih et al. ............. | 430/394 |
| 6,291,146 | B1 * | 9/2001 | Chang et al. ......... | 430/394 |
| 6,497,992 | B1 * | 12/2002 | Yunogami et al. .... | 430/313 |
| 7,575,854 | B2 * | 8/2009 | Suzuki et al. ........ | 430/321 |
| 2004/0180295 | A1 * | 9/2004 | Chang .................. | 430/313 |
| 2005/0105188 | A1 * | 5/2005 | Hayashi et al. ...... | 359/619 |
| 2005/0196708 | A1 * | 9/2005 | Hsu et al. ............. | 430/321 |
| 2006/0023314 | A1 * | 2/2006 | Boettiger et al. ..... | 359/621 |
| 2006/0029890 | A1 * | 2/2006 | Ulrich et al. ......... | 430/321 |
| 2006/0170810 | A1 * | 8/2006 | Kim ..................... | 348/340 |
| 2007/0166649 | A1 | 7/2007 | Yu | |
| 2008/0023734 | A1 * | 1/2008 | Cho ..................... | 257/290 |
| 2008/0157244 | A1 * | 7/2008 | Yun et al. ............. | 257/432 |
| 2008/0193718 | A1 * | 8/2008 | Suwa et al. ........... | 428/156 |
| 2009/0130602 | A1 * | 5/2009 | Shim .................... | 430/312 |

FOREIGN PATENT DOCUMENTS

| | | | |
|---|---|---|---|
| JP | 08-021908 | * | 1/1996 |
| JP | 2003-107721 | * | 4/2003 |
| JP | 2006-308960 | * | 11/2006 |

* cited by examiner

*Primary Examiner* — Martin Angebranndt  
(74) *Attorney, Agent, or Firm* — Winston Hsu; Scott Margo

(57) ABSTRACT

A method for fabricating an image sensor is disclosed. First, a semiconductor substrate is provided, in which a photosensitive region is defined on the semiconductor substrate. At least one photosensitive material is then formed on the semiconductor substrate, and a first exposure process is performed to form a tapered pattern in the photosensitive material. A second exposure process is performed to form a straight foot pattern in the photosensitive material, and a developing process is performed to remove the tapered pattern and straight foot pattern to form the photosensitive material into a plurality of photosensitive blocks. A reflow process is conducted thereafter to form the photosensitive blocks into a plurality of microlenses.

7 Claims, 3 Drawing Sheets

METHOD FOR FABRICATING AN IMAGE SENSOR

BACKGROUND OF THE INVENTION

1. Field of the Invention

The invention relates to a method for fabricating an image sensor.

2. Description of the Prior Art

As the development of digital cameras and scanners progresses, the demand for image sensor also increases accordingly. In general, today's image sensors in common usage are divided into two main categories: charge coupled device (CCD) sensors and CMO image sensors (CIS). The application of CMOS image sensors has increased significantly for several reasons. Primarily, CMOS image sensors have certain advantages of offering low operating voltage, low power consumption, and the ability for random access. Additionally, CMOS image sensors are currently capable of integration with the semiconductor fabrication process.

The CMOS image sensor separates (i.e., classifies) incident light into a combination of light of different wavelengths. The light of different wavelengths is received by respective sensing elements and is subsequently transferred into digital signals of different intensities. For example, the CMOS image sensor can consider incident light as a combination of red, blue, and green light. Those wavelengths are subsequently received by photodiodes, and then transformed into digital signals. However, in order to separate incident light, a monochromatic color filter array (CFA) must be set above every optical sensor element.

Referring to FIGS. 1-2, FIGS. 1-2 are perspective views illustrating a method for fabricating an image sensor according to the prior art. As shown in FIG. 1, a semiconductor substrate 100 is provided, in which at least a photosensitive region 132 is defined on the semiconductor substrate 100. A plurality of photodiodes 122, CMOS transistors (not shown), and shallow trench isolations 120 surrounding the photodiodes 122 are formed on the semiconductor substrate 100. Each of the photodiodes 122 is electrically connected to at least one of the transistors, and the shallow trench isolations 120 are used as an insulator between two adjacent photodiodes 122 for preventing short circuit.

Next, a planarizing layer 102 is deposited on the photodiodes 122 and the transistors, and a plurality of dielectric layers 104,106 and patterned metal layers 124, 126 are formed on the planarizing layer 102. The metal layers 124 and 126 are formed on top of each shallow trench isolation 120 to avoid covering each photodiode 122, which further prevents scattering of incident lights and cross talk of signals while the lights are gathered at the photodiodes 122. The metal layers 124, 126 are also a part of the multilevel interconnects formed within the circuits of the CMOS transistor. Next, a passivation layer 108 is formed on the dielectric layer 106, and a silicon nitride layer 110 is deposited to prevent mist and other impurities from entering the device.

A plurality of color filters 128 typically composed of R/G/B filter patterns are formed on the silicon nitride layer 110, in which the color filters 128 are disposed specifically on top of each photodiode 122. A planarizing layer 112 is then deposited on the color filters 128, and a photosensitive material (not shown) composed of resin is coated over the surface of the planarizing layer 112. The photosensitive material is composed of I-line photoresist adapted for wavelength of 365 nm.

Next, an exposure process is conducted with a 365 nm UV light on the photosensitive material, and a developing process is performed thereafter to form the photosensitive material into a plurality of photosensitive blocks 130.

After the photosensitive blocks 130 are formed, as shown in FIG. 2, a reflow process is performed by exposing the image sensor 140 to high temperature for 5-10 minutes. The high temperature utilized during the process transforms the photosensitive blocks 130 to a plurality of microlenses 134, in which each of the microlenses 134 has a semi-circular surface. This completes the fabrication of a conventional CMOS image sensor.

It should be noted that in the conventional art, only one exposure process is conducted during the transformation stage of the photosensitive material into a plurality of photosensitive blocks. As the gaps between photosensitive blocks 130 are mostly dependent upon the resolution of the photolithography process, the current approach of utilizing only one exposure process for fabricating microlenses 134 still has the disadvantage of producing large gaps 138 between microlenses 134. This increase in gap size not only reduces the area for collecting light, but also lowers the color saturation of the image sensor 140. Hence, it has become an important task in the field to fabricate image sensors with minimal gaps between microlenses.

SUMMARY OF THE INVENTION

It is therefore an objective of the present invention to provide a method for fabricating an image sensor for solving the aforementioned problem of producing large gaps between microlenses.

A method for fabricating an image sensor is disclosed. First, a semiconductor substrate is provided, in which a photosensitive region is defined on the semiconductor substrate. At least one photosensitive material is then formed on the semiconductor substrate, and a first exposure process is performed to form a tapered pattern in the photosensitive material. A second exposure process is performed to form a straight foot pattern in the photosensitive material, and a developing process is performed to remove the tapered pattern and straight foot pattern to form the photosensitive material into a plurality of photosensitive blocks. A reflow process is conducted thereafter to form the photosensitive blocks into a plurality of microlenses.

According to another aspect of the present invention, an image sensor is disclosed. The image sensor preferably includes: a semiconductor substrate having at least one photosensitive region defined thereon; a planarizing layer disposed on the semiconductor substrate; a plurality of photosensitive blocks disposed on the planarizing layer; and a plurality of funnel-shaped openings separating the photosensitive blocks, in which each of the funnel-shaped openings comprises at least one tapered portion and at least one straight foot portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
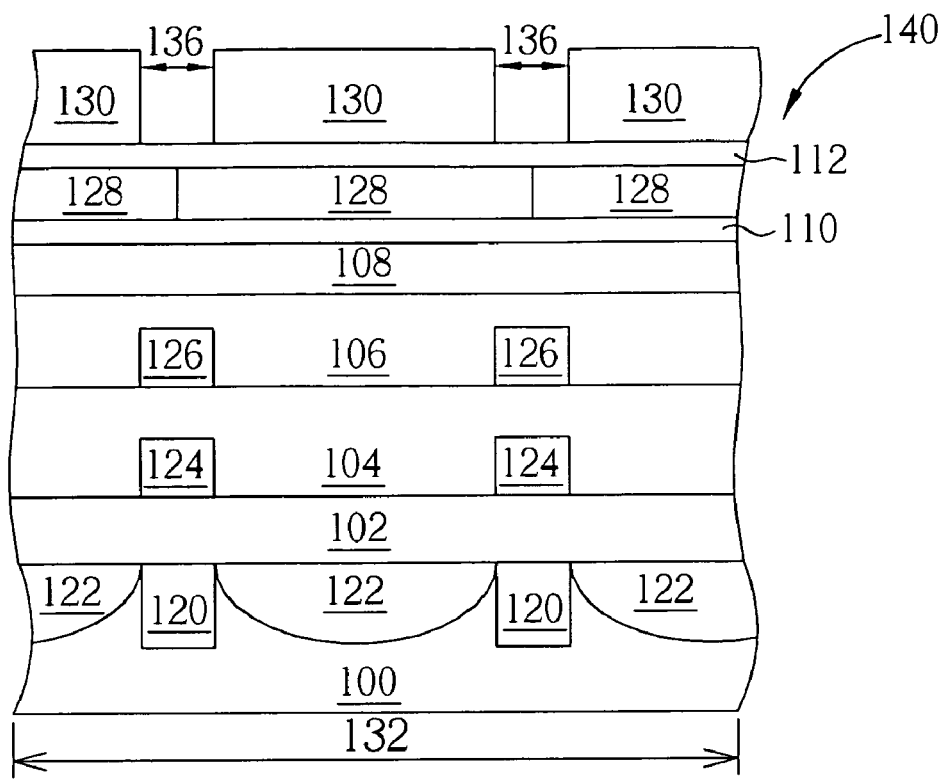
FIGS. 1-2 are perspective views illustrating a method for fabricating an image sensor according to the prior art.
Figure 2:
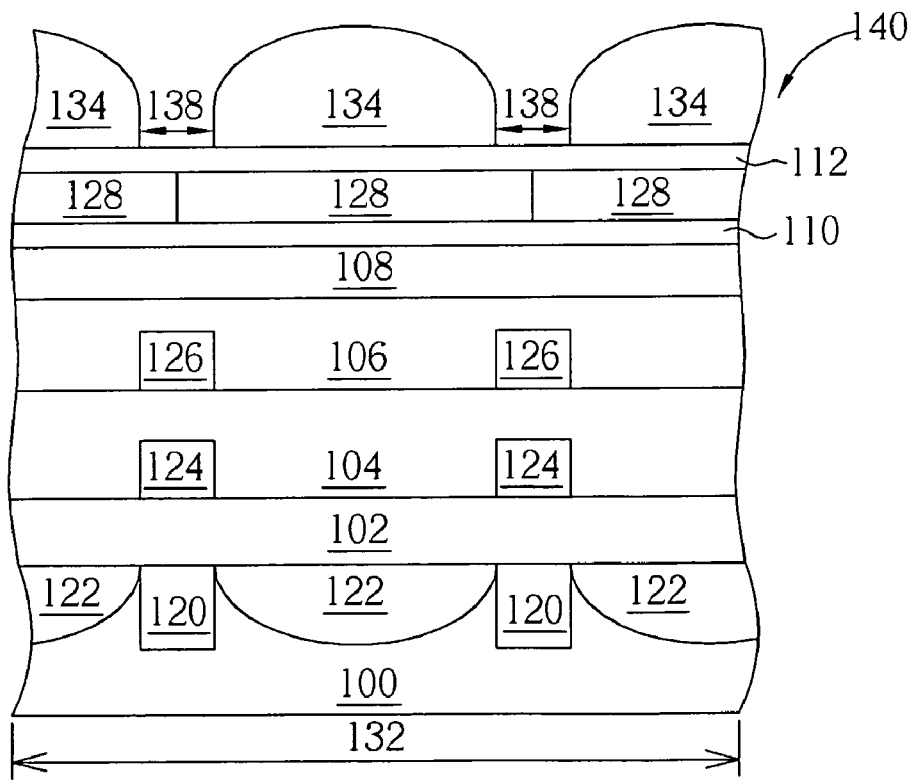
Figure 3:
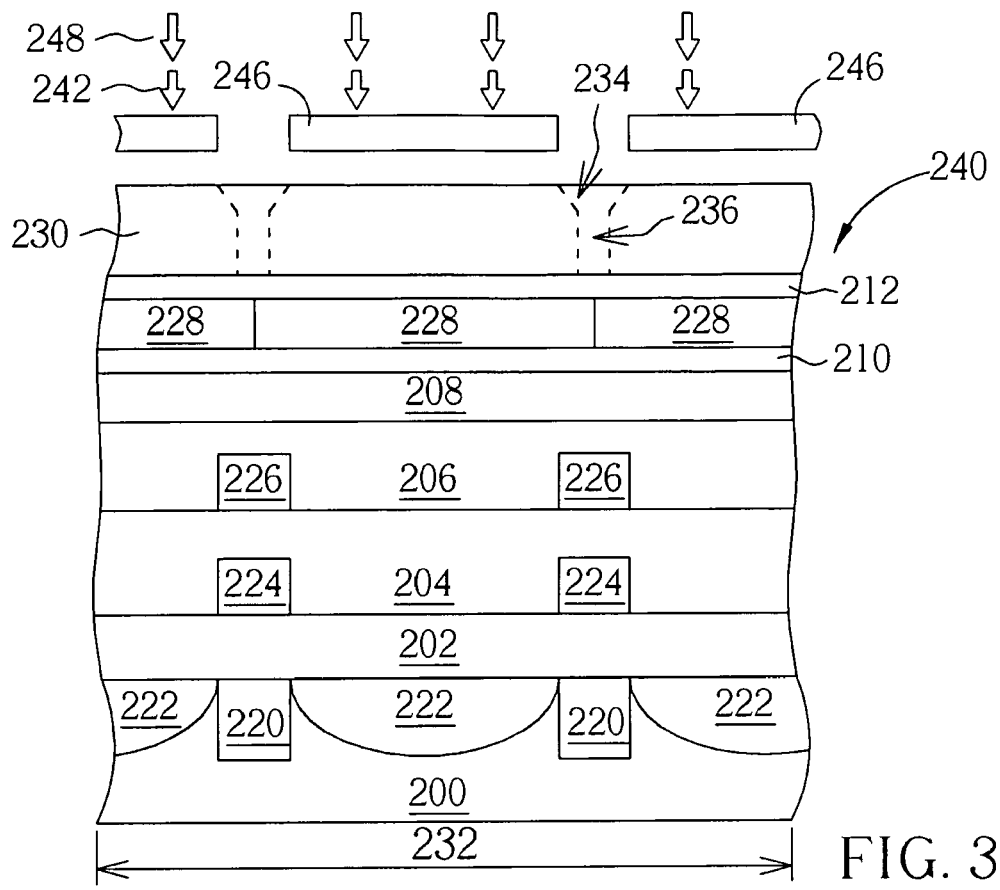
FIGS. 3-6 are perspective views illustrating a method for fabricating an image sensor according to a preferred embodiment of the present invention.

Referring to FIGS. 3-6, FIGS. 3-6 are perspective views illustrating a method for fabricating an image sensor 240 according to a preferred embodiment of the present invention. As shown in FIG. 3, a semiconductor substrate 200 is provided, in which at least a photosensitive region 232 is defined on the semiconductor substrate 200. A plurality of photodiodes 222, CMOS transistors (not shown), and shallow trench isolations 220 surrounding the photodiodes 222 are formed on the semiconductor substrate 200. Each of the photodiodes 222 is electrically connected to at least one of the transistors, and the shallow trench isolations 220 are used as an insulator between two adjacent photodiodes 222 for preventing short circuit.

Next, a planarizing layer 202 is deposited on the photodiodes 222 and the transistors, and a plurality of dielectric layers 204, 206 and patterned metal layers 224, 226 are formed on the planarizing layer 202. The metal layers 224 and 226 are formed on top of each shallow trench isolation 220 to avoid covering each photodiode 222, which also serve to prevent scattering of incident lights and cross talk of signals while the lights are gathered at the photodiodes 222. The metal layers 224, 226 are also part of the multilevel interconnects formed within the circuits of the CMOS transistor. Next, a passivation layer 208 is formed on the dielectric layer 206, and a silicon nitride layer 210 is deposited to prevent mist and other impurities from entering the device.

A plurality of color filters 228 composed of R/G/B filter patterns are formed on the silicon nitride layer 210, in which the color filters 228 are disposed specifically on top of each photodiode 222. A planarizing layer 212 is then deposited on the color filters 228, and a photosensitive material 230 composed of Novolak resin, photoactive compounds, and solvents is coated over the surface of the planarizing layer 212. The photosensitive material 230 is preferably composed of I-line photoresist adapted for wavelength of 365 nm. However, depending on the demand of the product, materials adapted for other wavelengths and composed of organic or inorganic photoresists could also be used as the photosensitive material for this process, which are all within the scope of the present invention.

Next, a two stage exposure process is conducted by using a light source of two different wavelengths to expose the photosensitive material 230 of the photosensitive region 232. For instance, a light source 242 having a wavelength of 365 nm is applied in combination with a photomask 246 to perform a first exposure process.

Preferably, the first exposure process is employed by using a defocus method, by adjusting the exposure time, or by adjusting the exposure energy.

For instance, when the first exposure process is performed, the depth of the exposure could be adjusted by moving the semiconductor substrate 200 upward or downward to achieve a defocus. According to a preferred embodiment of the present invention, the focusing depth obtained by the defocusing approach for the first exposure process is decreased for 0.5 microns. In other words, the exposure equipment carrying the semiconductor substrate 200 is adjusted by lowering the height of the semiconductor substrate 200 for approximately 0.5 microns, and an exposure of 365 nm is conducted thereafter.

Additionally, the exposure time of the first exposure process could also be adjusted. Preferably, the exposure time of the first exposure process is less than or equal to 180 ms, and the optimal exposure time is set at 80 ms.

By using a defocus approach or adjusting the exposure time to lower the exposure depth for the first exposure process, a tapered pattern 234 is formed in the photosensitive material 230.

Next, a second exposure using a light source with wavelength less than the adapted wavelength of the photosensitive material 230 is performed. For instance, a light source 248 having a wavelength of 248 nm is applied with the same photomask 246 used during the first exposure process for performing the second exposure process. By using a light source 248 having a wavelength of 248 nm to perform the second exposure, a deeper and shallower straight foot pattern 236 is formed in the photosensitive material 230.

According to the aforementioned embodiment of the present invention, the wavelength of the light source used by the first exposure process is preferably greater than or equal to the wavelength used by the second exposure process. However, a light source having shorter wavelength (such as 248 nm) could also be used as the light source for the first exposure process, whereas a light source having longer wavelength (such as 365 nm) could be used as the light source for the second exposure process, which are all within the scope of the present invention.

It should be noted that the aforementioned first exposure and second exposure process are both accomplished with a single exposure step. However, a plurality of sub-exposure processes could be employed to replace the aforementioned single exposure process.

Figure 4:
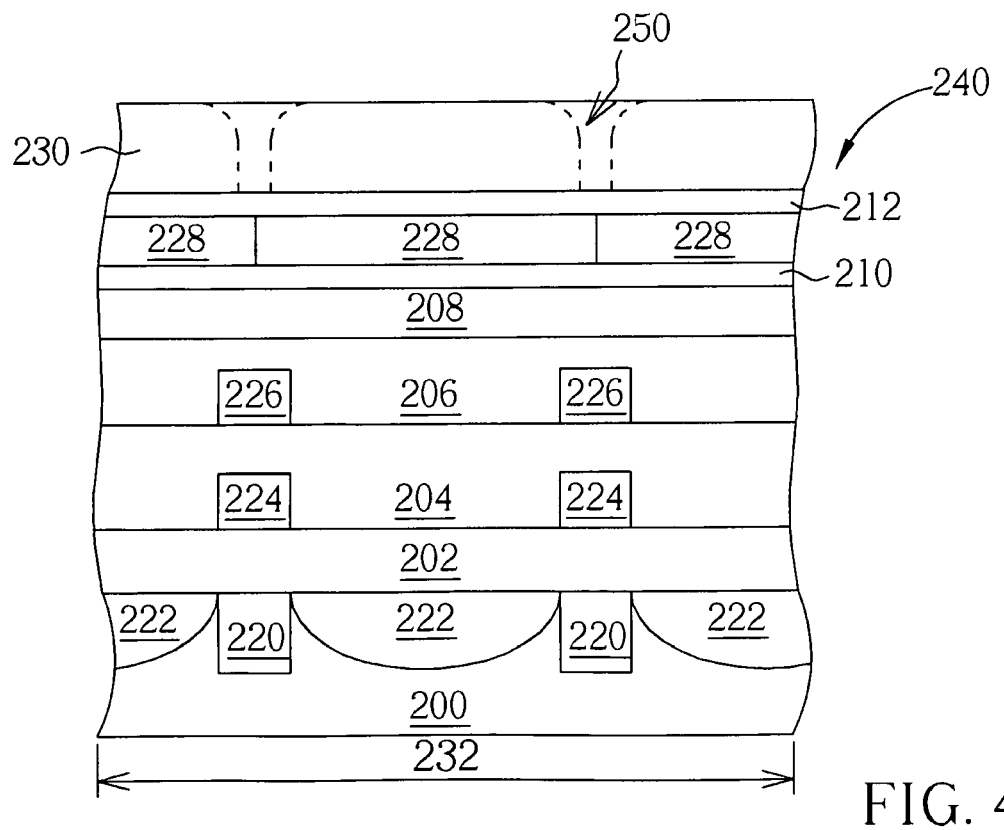
Figure 5:
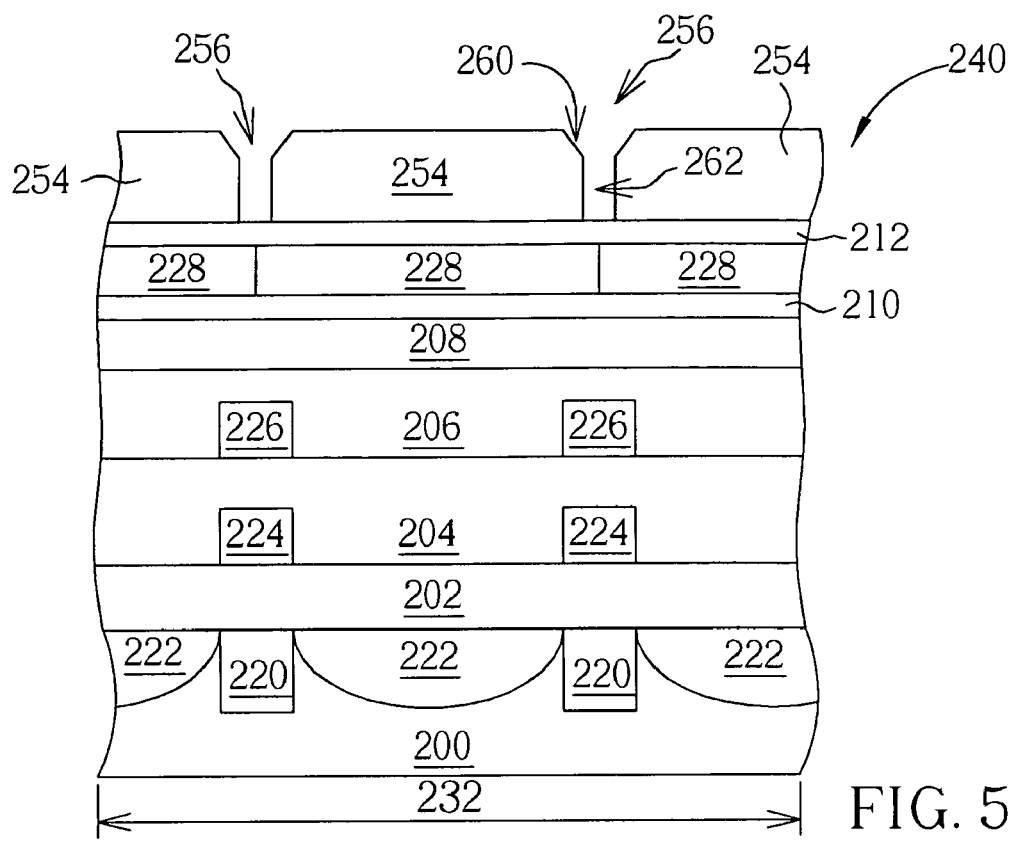
Figure 6:
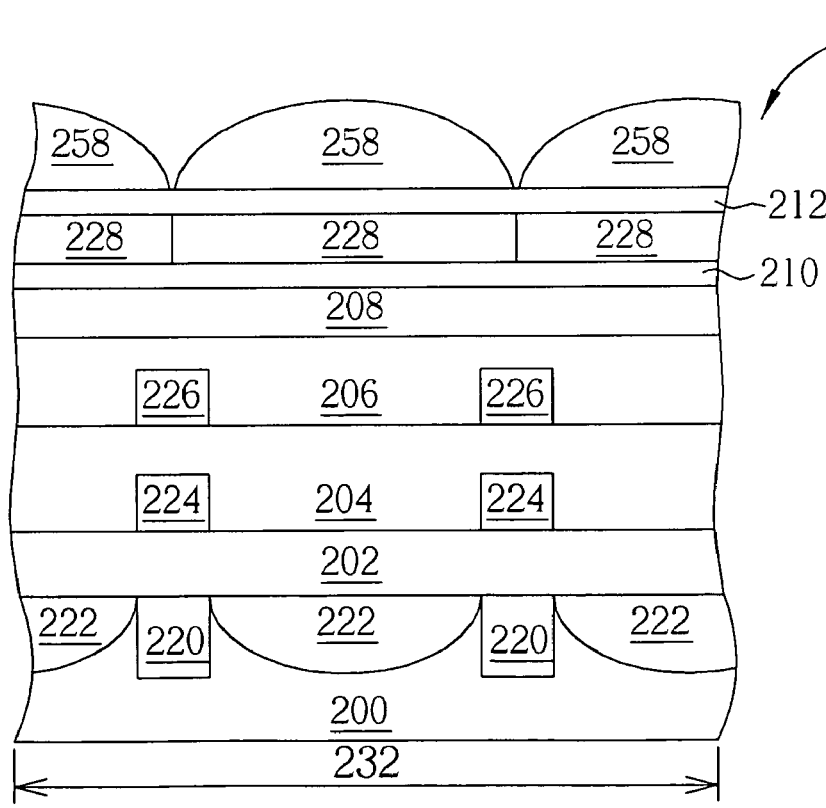

For instance, a plurality of sub-exposure processes is performed directly on the photosensitive material 230 to form the tapered pattern 234 with slight variations. It should be noted that parameters such as exposure time, number of exposure, focusing distance, wavelength of the light source, and exposure energy can be further adjusted while the sub-exposures are conducted. According to an embodiment of the present invention, the sub-exposures are conducted to form a plurality of gradient tapered pattern 250 in the photosensitive material 230, as shown in FIG. 4. Next, as shown in FIG. 5, a developing process is performed after the second exposure to remove the straight foot pattern 236 and the tapered pattern 234. This separates the photosensitive material 230 into a plurality of photosensitive blocks 254 and at the same time forms a funnel-shaped gap 256 between the photosensitive blocks 254. As shown in FIG. 6, a reflow process is performed to form the photosensitive blocks 254 into a plurality of microlenses 258 and complete the fabrication of the image sensor 240.

Referring again to FIG. 5, which further demonstrates an image sensor structure of the present invention. As shown in FIG. 6, the image sensor 240 of the present invention includes a semiconductor substrate 200, a plurality of dielectric layers 204, 206 and patterned metal layers 224, 226 disposed on the semiconductor substrate 200, a plurality of color filters 228 disposed on the dielectric layer 206, a planarizing layer 212 covering the color filters 228, and a plurality of photosensitive blocks 254 disposed on the planarizing layer 212. A funnel-shaped gap 256 is formed between the photosensitive blocks 254, in which this gap 256 is composed of at least one tapered portion 260 and at least one straight foot portion 262.

Overall, the present invention first performs two exposure processes with light source having at least two different wavelengths on a photosensitive material, and conducts a developing process thereafter to remove the tapered pattern and straight foot pattern formed in the photosensitive material. The removal of these two patterns separates the photosensitive material into a plurality of photosensitive blocks and forms a plurality of funnel-shaped gaps between the photosensitive blocks. By conducting two exposure processes on the photosensitive material, the present invention significantly reduces the gap between microlenses and fabricates microlenses with much circular surface. The result not only increases the resolution of the lens and the area for collecting incident lights, but also improves the color saturation of the image sensor significantly.

Those skilled in the art will readily observe that numerous modifications and alterations of the device and method may be made while retaining the teachings of the invention.

What is claimed is:

1. A method for fabricating an image sensor, comprising:
providing a semiconductor substrate having a photosensitive region defined thereon;
forming at least one photosensitive material on the semiconductor substrate;
performing a first exposure process for forming a tapered pattern and a first exposure depth in the photosensitive material, wherein the first exposure depth is less than an entire thickness of the photosensitive material using a photomask and defocussed light;
performing a second exposure process for forming a straight foot pattern and a second exposure depth in the photosensitive material using the photomask after performing the first exposure process for forming the tapered pattern, wherein the wavelength of the first exposure process is greater than or equal to the wavelength of the second exposure; and the first exposure depth is less than the second exposure depth;
performing a developing process after two sequential exposure processes to form the photosensitive material into a plurality of photosensitive blocks; and
performing a reflow process to form the photosensitive blocks into a plurality of microlenses.

2. The method of claim 1, wherein the wavelength of the first exposure process is 365 nm.

3. The method of claim 1, wherein the wavelength of the second exposure process is 248 nm.

4. The method of claim 1, wherein the defocus distance of the first exposure is 0.5 microns more than the focal distance of the second exposure.

5. The method of claim 1, wherein the exposure time of the first exposure process is between 80 ms to 180 ms.

6. A method for fabricating an image sensor, comprising:
providing a semiconductor substrate having a photosensitive region defined thereon;
forming at least one photosensitive material on the semiconductor substrate;
performing a first exposure process for forming a tapered pattern and a first exposure depth in the photosensitive material, wherein the first exposure depth is less than an entire thickness of the photosensitive material, and the first exposure process comprises using a same photomask and wavelength to perform a plurality of sub-exposure processes for forming a plurality of gradient tapered portions in the photosensitive material by defocus method;
performing a second exposure process with the same photomask for forming a straight foot pattern and a second exposure depth in the photosensitive material, wherein the first exposure depth is less than the second exposure depth;
performing a developing process after two sequential exposure processes to form the photosensitive material into a plurality of photosensitive blocks; and
performing a reflow process to form the photosensitive blocks into a plurality of microlenses.

7. The method of claim 6, further comprising utilizing light sources of different wavelengths for performing the sub-exposure processes.

* * * * *